US008419984B2

(12) United States Patent
Lubomirsky et al.

(10) Patent No.: US 8,419,984 B2
(45) Date of Patent: Apr. 16, 2013

(54) SUPER-PYROELECTRIC FILMS AND PROCESS OF THEIR PREPARATION

(75) Inventors: Igor Lubomirsky, Petach Tikva (IL); Vera Lyahovitsky, Rehovot (IL); Alexander L. Roytburd, Gaithersburg, MD (US)

(73) Assignees: Yeda Research and Development Company Ltd., Rehovot (IL); University of Maryland, College Park, MD (US)

( * ) Notice: Subject to any disclaimer, the term of this patent is extended or adjusted under 35 U.S.C. 154(b) by 667 days.

(21) Appl. No.: 12/304,641

(22) PCT Filed: Jun. 17, 2007

(86) PCT No.: PCT/IL2007/000731
§ 371 (c)(1),
(2), (4) Date: Jul. 27, 2009

(87) PCT Pub. No.: WO2007/144892
PCT Pub. Date: Dec. 21, 2007

(65) Prior Publication Data
US 2010/0059724 A1 Mar. 11, 2010

Related U.S. Application Data

(60) Provisional application No. 60/813,692, filed on Jun. 15, 2006.

(51) Int. Cl.
*D01B 1/02* (2006.01)
(52) U.S. Cl.
USPC ...................................... 252/520.21; 252/500
(58) Field of Classification Search .................. 252/500, 252/520, 21
See application file for complete search history.

(56) References Cited

U.S. PATENT DOCUMENTS

| | | | |
|---|---|---|---|
| 2,803,553 A * | 8/1957 | Oshry | 501/138 |
| 5,169,551 A | 12/1992 | Tsunooka et al. | |
| 6,287,486 B1 * | 9/2001 | Chen et al. | 264/1.21 |
| 6,827,915 B1 | 12/2004 | Tauber et al. | |
| 6,899,744 B2 * | 5/2005 | Mundschau | 95/56 |
| 7,413,912 B2 * | 8/2008 | Chen et al. | 438/3 |
| 7,794,629 B2 * | 9/2010 | Youngs | 252/512 |
| 2004/0129885 A1 | 7/2004 | McKenney | |
| 2005/0079659 A1 * | 4/2005 | Duan et al. | 438/197 |
| 2005/0107870 A1 * | 5/2005 | Wang et al. | 623/1.44 |
| 2006/0118765 A1 * | 6/2006 | Lubomirsky | 252/500 |
| 2006/0151820 A1 * | 7/2006 | Duan et al. | 257/296 |
| 2007/0120167 A1 * | 5/2007 | Duan et al. | 257/296 |
| 2010/0171063 A1 * | 7/2010 | Su et al. | 252/62.9 PZ |

OTHER PUBLICATIONS

Wersing, W. and Bruchhaus, R. (2000, Pyroelectric devices and applications, in D.J. Deborah (2000). Handbook of Thin Film Devices, vol. 5 Academic Press, San Diego).*
Poly crystalline Macro-domains Formed by Self-Organization of Ferroelectric Grains. Lyahovitskaya et al. Adv. Mater. 2005, 1956-1960.*
International Search Report and Written Opinion, mailed Dec. 19, 2007, from of International Application No. PCT/IL2007/000731, filed Jun. 17, 2007.
International Preliminary Report on Patentability, dated Mar. 17, 2009, from of International Application No. PCT/IL2007/000731, filed Jun. 17, 2007.
Ebralidze, I. et al., "Anomalous pre-nucleation volume expansion of amorphous BaTiO3," J. Mater. Chem. 15, 2005, 4258-4261.
Frey, M. H. et al., "Nanocrystalline barium titanate: Evidence for the absence fo ferroelectricity in sol-gel derived thin-layer capacitors," Appl. Phys. Lett. 63 (20), 1993, 2753-2755.
Frey, M. H. et al., "Grain-size effect on structure and phase transformations for barium titanate," Phys. Rev. B 54 (5), 1996, 3158-3168.
Jona, F. et al., "Ferroelectric crystals," New York: Dover Publications, 1998.
Kunitake, T., "Synthetic Bilayer Membranes: Molecular Design, Self-Organization, and Application," Angew. Chem. Int. Ed. Engl. 31, 1992, 709-726.
Lyahovitskaya, V. et al., "Polycrystalline Macro-Domains Formed by Self-Organization of Ferroelectric Grains," Adv. Mater. 17, 2005, 1956-1960.
Roytburd, A. et al., "Non-Local Elasticity of Polydomain Phases," Scripta Metallurgica et Materialia 27, 1992, 1343-1347.
Zembilgotov, A. G. et al., "Phase states of nanocrystalline ferroelectric ceramics and their dielectric properties," J. Appl. Phys. 97, 2005, 114315.

* cited by examiner

*Primary Examiner* — Mark Eashoo
*Assistant Examiner* — M. Reza Asdjodi
(74) *Attorney, Agent, or Firm* — Browdy and Neimark, PLLC

(57) ABSTRACT

A film is presented having super-pyroelectric properties. The film comprises nano-sized grains being in a ferroelectric phase and having at least three different crystallographic variants defining at least two polycrystalline macro-domains. The film is shaped to define at least one film region with the macro-domains of a predetermined shape and different orientations of crystallographic axes with respect to the film's surface, thereby enabling to apply a temperature change to the film to induce movement of the polycrystalline macro-domains boundaries enabling super-pyroelectric properties.

20 Claims, 6 Drawing Sheets

SUPER-PYROELECTRIC FILMS AND PROCESS OF THEIR PREPARATION

RELATED APPLICATIONS

This application is a 371 National Stage of International Application Number PCT/IL2007/000731, filed on Jun. 17, 2007, which in turn claims the benefit under 35 USC 119(e) of U.S. Provisional Application No. 60/813,692, filed on Jun. 15, 2006, both of which are incorporated herein by reference in their entirety.

FIELD OF THE INVENTION

This invention relates to inorganic pyroelectric films and more particularly to super-pyroelectric films and to process for their preparation.

REFERENCES

The following references are considered to be pertinent for the purpose of understanding the background of the present invention:

[1] U.S. Pat. No. 2,803,553 to Oshry et al., describes barium titanate ceramic dielectrics having high dielectric constants and having cubic crystal structures.

[2] U.S. Pat. No. 5,169,551 to Tunooka et al., describes a piezoelectric composite material prepared by compounding a ferroelectric ceramic powder comprising microcrystals.

[3] U.S. Pat. No. 6,827,915 to Tauber et al., describes rare earth metal compounds for use in high critical temperature thin film super-conductors, ferroelectrics, pyroelectrics, piezoelectrics and hybrids.

[4] A. Roytburd, M. Wuttig, and I. Zhukovskiy, *Scripta Metallurgica et Materialia* 1992, 27, 1343.

[5] G. G. Krainyk and A. I. Otko, *Izvestiya Akademii Nauk SSSR Seriya Fizicheskaya* 1989, 53, 1407.

[6] T. Kunitake, *Angew. Chem. Int. Ed. Engl.* 1992, 31, 709.

[7] M. H. Frey and D. A. Payne, *Appl. Phys. Lett.* 1993, 63, 2753.

[8] M. H. Frey and D. A. Payne, *Phys. Rev. B* 1996, 54, 3158.

[9] A. G. Zembilgotov, N. A. Pertsev, and R. Waser, *J. Appl. Phys.* 2005, 97.

[10] F. Jona and G. Shirane, *Ferroelectric crystals*, Dover Publications, New York 1998.

BACKGROUND OF THE INVENTION

Pyroelectricity in crystals is produced due to a change in the surface charge exhibited as a change of spontaneous polarization of crystals in response to a temperature change. The temperature dependence of the polarization change is usually weak (<1% $K^{-1}$), apart from in the vicinity of a ferro-to paraelectric phase transition. In polycrystals, misalignment of crystallographic axes and elastic interaction between the grains significantly reduces the polarization, thereby reducing the pyroelectric properties of polycrystals. In particular, in nanocrystalline barium titanate ($BaTiO_3$), the transition to the ferroelectric (pyroelectric) phase is usually partially or completely suppressed, further reducing any measurable pyroelectric properties.

GENERAL DESCRIPTION

There is a need in the art to produce films having super-pyroelectricity properties. The invention provides a novel film having nano-sized grains being in a ferroelectric phase that may form at least three crystallographic variants and are self-organized into polycrystalline macro-domains. This structure enables movement of the polycrystalline macro-domains boundaries induced by a temperature change applied thereto and thereby inducing super-pyroelectric properties to the film. The movement of the polycrystalline macro-domains boundaries results in switching of at least some of the grains from an out-of-plane to an in-plane domain ("90° polarization switching"), which property is reversible by appropriate energy application to the film (e.g. heating/cooling). It should be understood that this switching is a result of a mechanical deformation in the grains, which is induced by a temperature change and which is allowed due to the existence of at least three different crystallographic variants. The latter condition is achievable in a buckled film having an arc-shaped region (supported only at the edged portions thereof) thus defining the macro-domains of a certain shape and different orientations of crystallographic axes with respect to the film's surface.

Thus, according to a broad aspect of the invention, there is provided a film having nano-sized grains being in a ferroelectric phase and having at least three different crystallographic variants defining at least two polycrystalline macro-domains, the film being shaped to define at least one film region with the macro-domains of a predetermined shape and different orientations of crystallographic axes with respect to the film's surface, thereby enabling to apply a temperature change to the film to induce movement of the polycrystalline macro-domains boundaries enabling super-pyroelectric properties.

The films are self-supported films, for example of nanocrystalline $BaTiO_3$, exhibiting a pyroelectric coefficient ("super-pyroelectricity") of the order of 1 $\mu C/(cm^2 \cdot K)$, which is up to two orders of magnitude greater than the value measured for a single crystal. The film has at least an arc-shaped region enclosed between linear-shaped regions.

This super-pyroelectricity appears in buckled films wherein a multitude of nanocrystalline (30-80 nm) ferroelectric grains has self-organized into polycrystalline macro-domains, regions wherein the directionality of the spontaneous polarization of the grains is organized. These regions are similar to elastic domains in crystals, but may contain hundreds or thousands of single-domain grains.

The enhancement of the pyroelectric coefficient strongly depends on film geometry and appears in buckled films where ferroelectric grains undergo self-organization into polycrystalline macro-domains.

Nano-sized grains may reduce the intergrain stress by spontaneously forming zones (termed polycrystalline macro-domains) within which the crystallographic directions of the grains become correlated. In the buckled film, the nano-sized grains self-organize into two types of macro-domains: (1) those with polarization (and thus c-axis) of the grains aligned as closely as possible to the perpendicular to the film (henceforth "out-of-plane" macro-domains) and (2) those with polarization (and c-axis) of the grains aligned as closely as possible within the film plane (henceforth "in-plane" macro-domains).

In response to temperature variations, the magnitude of polarization in each grain and the crystallographic parameters c and a change. As a result, the radius of the wedge-ordered regions is altered and the equilibrium combination of the linear and wedge-ordered regions changes as well. The linear regions contain only out-of-plane macro-domains, whereas the wedge-ordered regions include alternating in-plane and out-of-plane macro-domains.

In some embodiments, the film has a pyroelectric coefficient of at least 0.2 μC/(cm²·K).

In some embodiments, the buckled film with the arc-shaped region comprises a wedge-ordered portion (curved to be characterized by the at least three crystallographic axes) enclosed between two linear regions. This structure can be determined by such a parameter as an excess length E, which is defined as ((l−w)/w), wherein l is the length of the entire arc-shaped buckled region according a certain axis and w is a distance between the edges portions of the arc-shaped-region. In some cases, the excess length is at least 3%. In some further cases, the excess length is at least 5%. In yet some further cases, the excess length is at least 7%. In some cases, the excess length is at least is up to 8%

In some embodiments, the pyroelectric coefficient increases with increasing excess length.

In some embodiments, the pyroelectric coefficient is up to 1 μCl/(cm²·K). In some further embodiments, the pyroelectric coefficient is up to 2 μCl/(cm²·K).

In some cases, the polycrystalline macro-domains comprise wedge-ordered regions.

In some embodiments, an increase in the wedge-ordered regions is configured to induce an increase in the pyroelectric coefficient.

Typically the film material composition includes an oxide such as a titanate. In some embodiments, the oxide has the formula (A×B1−x)pOn, wherein A and B are independently selected from transitions metals, elements of Group IVA of the periodic table, alkali metals, alkali earth metals and rare earth metals; x has values of between 0 to 1; p is an integer having the values 1, 2 or 3; and n is an integer having the value of 1, 2, 3 or 4.

Generally any material having nano-scaled grains of ferroelectric phase forming three or four crystallographic variants can be used, for example lead titanate ($PbTiO_3$, three variants), lead zirconate-titanate ($Pb(Zr_xTi_{1-x})O_3$ x=0-0.45, three or four variants), barium titanate ($BaTiO_3$, three variants) and $Ba_{1-x}Sr_xTiO_3$ (x<0.5), $Ba(Zr_xTi_{1-x})O$, x<0.1 (three or four variants) having similar crystallographic structure (perovskite). In some embodiments, the film comprises barium titanate (BaTiO3). In some cases, lead titanate.

In some cases, the film has a thickness of at least 100 nm, sometimes at least 300 nm, and in some cases, at least 500 nm. In some further cases, the film has a thickness of at least 700 nm. In some cases, the film has a length of at least 50 μm, in some cases, up to a length of at least 100 μm. In some further cases, it has a length of at least 200 μm.

The present invention also provides novel process for preparing a super-pyroelectric film material including forming a film which has nano-sized ferroelectric grains self-organized into polycrystalline macro-domains and which is shaped to define at least one film region with the macro-domains of a predetermined shape and different orientations of crystallographic variants with respect to the film's surface; and, applying a temperature change to the material so as to induce a super-pyroelectric effect associated with said at least one region of the film.

In some embodiments, applying a temperature change to the material affects the curvature of said arc-shaped region.

In some embodiments, increasing the temperature applied to the film results in an increase in the curvature of the arc-shaped region.

In some embodiments, applying a temperature change to the material induces a greater proportion between the arc-shaped region and linear-shaped regions enclosing said arc-shaped region therebetween.

This invention also discloses a device comprising the film described herein. In some embodiments, the device is configured and operable as a motion sensor and/or a microphone.

The sensitivity of such devices is in proportion to the increased pyroelectric properties of the buckled film.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 4A shows a top view in reflected light at room temperature; and FIGS. 4B and 4C show views with transmitted cross-polarized light at room temperature (FIG. 4B) and at 90° C. (FIG. 4C). The birefringent (light) areas are the wedge-ordered regions), in accordance with some embodiments of the present invention;

DETAILED DESCRIPTION OF EXEMPLARY EMBODIMENTS

The invention provides novel nanocrystalline ferroelectric films having super-pyroelectricity properties and process for their preparation. Super-pyroelectricity is observed when the pyroelectric coefficient of such films is two orders of magnitude larger than that observed in single crystals under similar conditions. This super-pyroelectricity has its origin in the self-organization of nano-sized ferroelectric grains into macroscopic elastic domains.

This phenomenon observed in buckled self-supported $BaTiO_3$ films is disclosed in a publication, V. Lyahovitskaya, Y. Feldman, I. Zon, E. Wachtel, I. Lubomirsky, and A. L. Roytburd, Adv. Mater. 2005, 17, 1957, which is incorporated herein by reference. The process of production of self-supported $BaTiO_3$ films is disclosed in a publication I Ebralidze, V. Lyahovitskaya, Y. Feldman, I. Zon, E. Wachtel, I. Lubomirsky, J. Mater. Chem. 2005 15:4258-4261, which is also incorporated herein by reference.

Figure 1A:
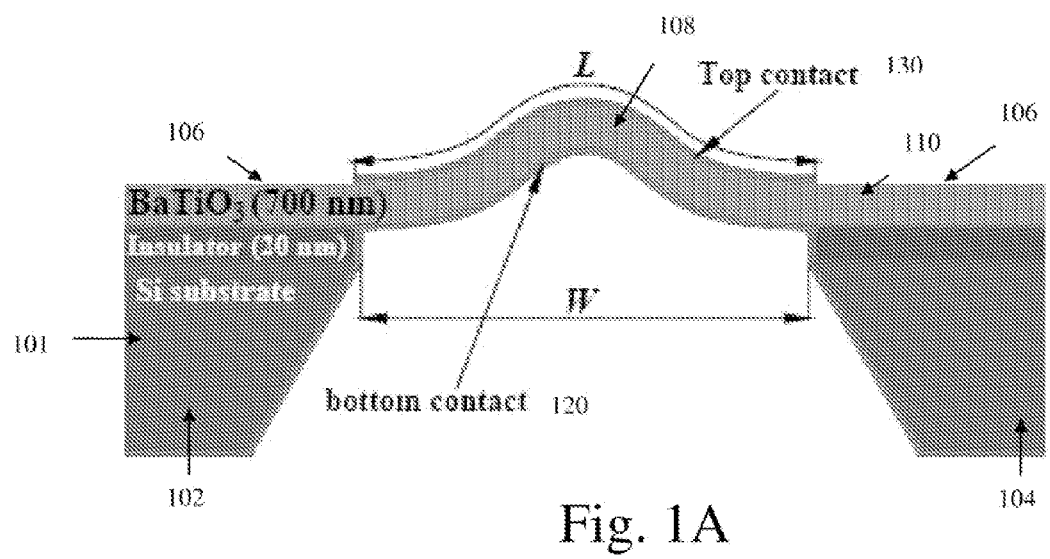
FIG. 1A is a simplified schematic diagram of a self-supported tethered film, in accordance with some preferred embodiments of the present invention.

Reference is now made to FIG. 1A, which is a simplified schematic diagram of a self-supported film 110, in accordance with some embodiments of the present invention. The film is deposited onto a support 101, such as a silicon substrate, having at least two supporting regions 102, 104 for supporting film 110. The film may be formed in accordance with the process described hereinbelow.

Film 110 is exemplified, but not limited to, barium titanate, though the present invention may utilize other ceramic oxides, such as titanium containing oxides. Lead titanate and other ceramic materials may be used to form film 110.

In some embodiments, film 110 is sputtered onto substrate 101, though other alternative material deposition methods known in the art may be employed. For example, amorphous layers of $BaTiO_3$ are deposited at room temperature by RF oxygen/argon (80/20 v/v, $4 \times 10^{-3}$ mBar) plasma sputtering from a stoichiometric target on (100)-oriented n-type Si substrates (280±20 μm thick, 1-10 Ωcm). The substrate is etched to form at least one hole or window therein employing one or more etchants that do not etch film 110. Film 110 has at least one buckled region 108, and has at least two substantially planar regions 106 (along the film plane) supported by the supporting regions 102, 104 of the substrate. The buckled region has an excess length, $\in_1$, defined as (L−W)/W, wherein W is the length of the buckled region and L is the actual length of the buckled region. Thereafter, a lower contact layer 120 and a higher contact layer 130 are deposited/formed onto the film 110. In some embodiments the lower and higher contact layers cover the entire buckled region 108. The excess length of film 110 may vary from 0 to 8%. In the present example, continuous bottom contacts (i.e. 100 nm Ag) and lithographically defined top contacts (i.e. 300 nm Ag) were deposited by sputtering. The thickness of film 110 may be up to 1500 nm. The length of the film may be varied from 50 to 2000 μm.

Figure 1B:
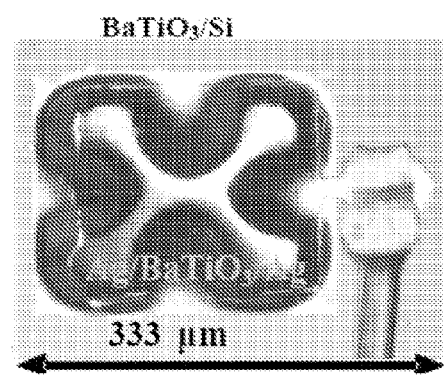
FIG. 1B is a top view of a barium titanate ($BaTiO_3$) film (750 nm thickness) with contacts and bonded wire, in accordance with some preferred embodiments of the present invention.

FIG. 1B shows a top view of a barium titanate ($BaTiO_3$) film having a thickness of 750 nm with contacts and bonded wires. The pyroelectric effect was measured in the nanocrystalline (30-80 nm) self-supported buckled films of BaTiO3 with 750±100 nm thickness and 200-250 μm lateral dimensions.

Figure 2A:
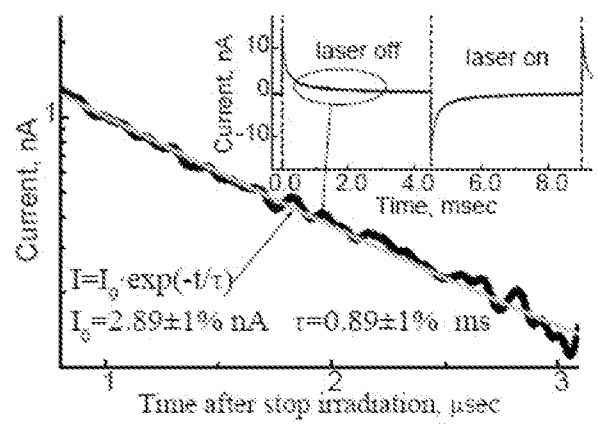
FIG. 2A is a graph showing a pyroelectric time response curve of a self-supported nanocrystalline film of ($BaTiO_3$) to a step-like temperature change fitted to an exponential decay equation, in accordance with some preferred embodiments of the present invention.
Figure 2B:
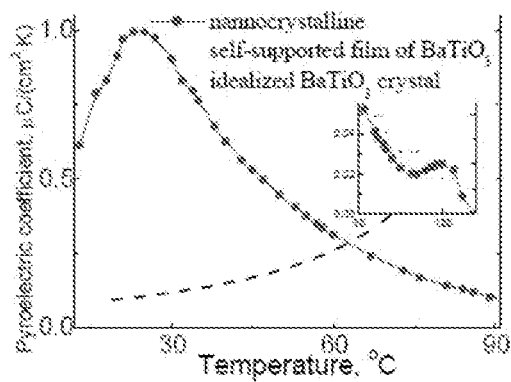
FIG. 2B is a graph showing the temperature dependence of the apparent pyroelectric coefficient of a) a self-supported nanocrystalline film of ($BaTiO_3$) (filled circles) and b) an ideal single barium titanate ($BaTiO_3$) crystal (dashed line), in accordance with some embodiments of the present invention.

Reference is now made to FIG. 2A, showing a pyroelectric time response curve of a self-supported nanocrystalline film of ($BaTiO_3$) to a step-like temperature change fitted to an exponential decay equation. FIG. 2B is a graph showing the temperature dependence of the apparent pyroelectric coefficient of a) a self-supported nanocrystalline film of ($BaTiO_3$) (filled circles) and b) an ideal single barium titanate ($BaTiO_3$) crystal (dashed line). The time dependence of the response to step-like heating or cooling followed an exponential decay law (FIG. 2A), from which the pyroelectric coefficient α was calculated. The pyroelectric coefficient of films with excess length $\in_1 >5\%$ is $\alpha = 0.2-1$ μC/(cm²·K) which is up two orders of magnitude higher than that of a single crystal of BaTiO3 at room temperature ($2 \times 10^{-2}$ μC/(cm²·K)). The pyroelectric coefficient of these films measured as a function of temperature has a clear maximum within the range of 20-50° C., above which the magnitude decays exponentially (FIG. 2B). This maximum is not related to the ferroelectric to paraelectric phase transition because the films remain in ferroelectric phase until ≈120° C. [V. Lyahovitskaya, Y. Feldman, I. Zon, E. Wachtel, I. Lubomirsky, and A. L. Roytburd, Adv. Mater. 2005, 17, 1957]. The pyroelectric coefficient shows another maximum at 120-140° C., and then vanishes completely. Films with excess length $\in_1 <2\%$ showed a significantly lower pyroelectric coefficient $(0.2-1) \times 10^{-2}$ μC/(cm²·K)(10-50% of the bulk value) and, similar to that of bulk BaTiO3, it has a maximum at 110-130° C., in the vicinity of the phase transition.

The experimental data described above are in sharp contrast with the well-known properties of nanocrystalline BaTiO3 [7-9]. This suggests that the generation of pyroelectric current in self-supported ferroelectric films has a fundamentally different origin from ordinary pyroelectricity.

Figure 3A:
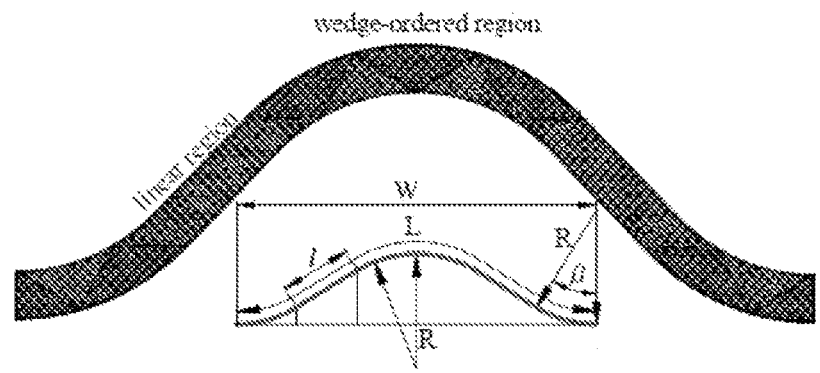
FIG. 3A is a simplified schematic diagram of polycrystalline macro-domains organized into linear and wedge-ordered regions in a buckled nanocrystalline ferroelectric film of $BaTiO_3$, in accordance with some embodiments of the present invention.

FIG. 3A is a simplified schematic illustration of polycrystalline macro-domains organized into linear and wedge-ordered regions in a buckled nanocrystalline ferroelectric film of $BaTiO_3$. As indicated above, the macro-domains self-assemble into linear (no curvature) and wedge-ordered (arc-shaped) regions. The equilibrium distribution of the linear and the wedge-ordered regions in a rectangular film tethered at all four edges is complex. However, qualitative understanding of the rearrangement of the macro-domains can be gained using a model for buckling. In this case, the film that has only two opposite edges tethe red and the other two are free.

Figure 3B:
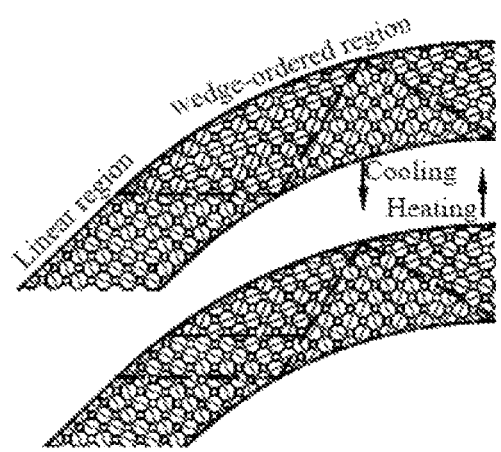
FIG. 3B is a simplified schematic illustration of the grain exchange between in-plane and out-of-plane macro-domains in response to a temperature change, in accordance with some embodiments of the present invention.

FIG. 3B is a simplified schematic illustration of the grain exchange between in-plane and out-of-plane macro-domains in response to a temperature change. The fraction of in-plane and out-of-plane macro-domains is such as to minimize elastic stress and, therefore, depend on mechanical constraints imposed on the films. Out-of-plane and in-plane macro-domains undergo further self-organization into linear (no curvature) and wedge-ordered arc-shaped regions with maximum curvature. The linear regions contain only out-of-plane macro-domains, whereas the wedge-ordered regions include alternating triangular-shaped in-plane and out-of-plane macro-domains.

It should be noted that the wedge-domains were theoretically predicted and experimentally confirmed in single-crystalline bent films. The radius of curvature of the wedge-ordered regions, R, is fixed by the crystallographic parameters a,c at a given temperature and the film thickness D, as $R=D/(c/a-1)$ (FIG. 3A). In polycrystals, the effective curvature radius is larger, because the mutual misalignment of the grains decreases the "effective" c/a ratio by a factor of 0.405. In a polycrystalline macro-domain with maximum possible alignment of the grains, each of which has a self-strain $t=a/c-1$ the "apparent" spontaneous strain is smaller by a factor of ≈0.543. There is a unique combination of linear and the wedge-ordered regions that minimizes bending stress.

Figure 3C:
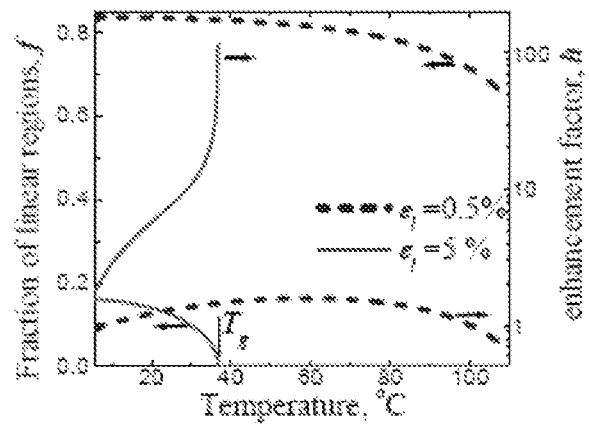
FIG. 3C is a graph showing the relation between the fraction of linear regions, f, and the pyroelectric coefficient enhancement factor, h, calculated for a 750 nm thick and 220 μm long bent self-supported film of $BaTiO_3$ with a) excess length $\in_1$=0.5 (dashed line) and b) excess length $\in_1$=5% (continuous line), in accordance with some embodiments of the present invention.

FIG. 3C is a graph showing the relation between the fraction of linear regions, f, and the pyroelectric coefficient enhancement factor, h, calculated for a 750 nm thick and 220 μm long bent self-supported film of $BaTiO_3$ with a) excess length $\in_1 =0.5\%$ (dashed line) and b) excess length $\in_1 =5\%$ (continuous line).

An electrical bias of 3 V applied across the film polarizes the grains in the out-of-plane macro-domains (up or down) but does not perturb the in-plane macro-domains. In response to temperature variations, the magnitude of polarization in each grain and the crystallographic parameters c and a change. As a result, the radius of the wedge-ordered regions is altered and the equilibrium combination of the linear and wedge-ordered regions changes as well.

To implement this change, some of the grains at the boundaries between the linear and the wedge-ordered regions must reversibly switch from an out-of-plane to an in-plane domain and vice versa ("90° polarization switching") as illustrated in FIG. 3B. Therefore, temperature variation changes both the magnitude of the polarization in all grains and the fraction of linear and wedge-ordered regions. Both processes may contribute to the generation of the pyroelectric current. The pyroelectric current collected by the contacts placed on the top and bottom of the film is produced only by the out-of-plane macro-domains. In the wedge-ordered regions, the pyroelectric current is strongly attenuated by the "in-plane" macro-domains, that can be viewed as a capacitor connected in series. Therefore, most of the pyroelectric current is collected from the surfaces of the linear regions and can be expressed as:

$$j(t) = \frac{\partial (P(T) \cdot f)}{\partial t} = A\left(f\frac{\partial P(T)}{\partial t} + P\frac{\partial f}{\partial t}\right), \quad (1)$$

where $f=2 \, l/L$ (inset FIG. 3A) is the fraction of linear regions.

The first term describes the current generated due to the changing polarization of grains that do not undergo 90° polarization switching (ordinary pyroelectric effect). The second term is due to the stress-induced 90° polarization switching in the grains at the boundaries between the linear and the wedge-ordered regions (super-pyroelectric effect). Polarization responds to the temperature variation within a few ns [10], therefore the first term can be written as $$\frac{\partial P(T)}{\partial T}\frac{\partial T}{\partial t}.$$

The contribution of the second term may be significant only if the changes in the macro-domains closely follow the temperature variation, being at equilibrium at each temperature. For the case under consideration, the observed pyroelectric effect is much larger than that regularly observed in BaTiO3 crystals. This implies that changes at the macro-domain boundaries occur at least with the same rate as heating and cooling of the film (<100 μsec, FIG. 2A).

Therefore, the pyroelectric current is given by:

$$j(t) = A\left(f\frac{\partial P(T)}{\partial T}\frac{\partial T}{\partial t} + P(T)\frac{\partial f}{\partial T}\frac{\partial T}{\partial t}\right) = A\left(f \cdot \alpha + P(T)\frac{\partial f}{\partial T}\right)\frac{\partial T}{\partial t} \quad (2)$$

where $\alpha$ is the pyroelectric coefficient of crystalline BaTiO3.

Then, the "apparent" pyroelectric coefficient of a buckled film with macro-domains is:

$$\alpha^* = f \cdot \alpha + P(T)\frac{\partial f}{\partial T}, \quad (3)$$

and the ratio $$h = \frac{\alpha^*}{\alpha} = f + \frac{P(T)}{\alpha}\frac{\partial f}{\partial T}$$

can be viewed as an enhancement factor.

The film geometry (FIG. 3A, inset) defines the fraction of the linear regions, f, as follows:

$$f(\varepsilon_1 + 1) \cdot \cos\left(\frac{1}{4z}(\varepsilon_1 + 1)(1-f)\right) + 4z\sin\left(\frac{1}{4z}(\varepsilon_1 + 1)(1-f)\right) = 1, \quad (4)$$

where is $z=R/W$ factor characterizing film geometry.

It should be noted that if l is the length of one linear region, then the fraction of the linear regions is $f=2 \, l/L=l/(l+2 \cdot R \cdot b)$ (Eq. A1); from the definition of the excess length $e_1=(L-W)/W=(2 \cdot l+4 \cdot R \cdot b-W)/W$ (Eq. A2) is obtained; from (A1) and (A2) $b=W \cdot (1-f) \cdot (1+e_1)/(4 \cdot R)$ and $l=f \cdot W \cdot (1+e_1)/2$ (Eq. A3) is obtained. Considering horizontal projections of all parts of the films $2 \cdot l \cdot \cos(b)+4 \cdot R \cdot \sin(b)=W$ (Eq. A4) is obtained. Substituting (A3) in (A4) and introducing $z=R/W$ Eq. 4 is obtained.

The temperature dependence of the crystallographic parameters a, c, the polarization P(T) and the pyroelectric coefficient $\alpha$ of BaTiO3 are well known [10]. Therefore, the fraction of the linear regions, f, and the enhancement factor, h, can be calculated numerically (FIG. 3C).

For a 720 nm thick 220 μm long film with $\epsilon_1$=0-10% a number of observations can be made as follows:

1. Films with excess length below 1% contain predominantly linear regions at all temperatures at which the ferroelectric phase exists. These films do not show the super pyroelectric effect (FIG. 3C dotted line).

2. In films with excess length above 3% the fraction of linear regions decreases with increasing temperature and drops to zero at a certain temperature, $T_1$, which may be viewed as a geometrical transition temperature between two types of macro-domain structures. Films with $\epsilon_1$=5-8% have $T_1$ close to room temperature (FIG. 3C solid line). Below the linear and the wedge-ordered regions can coexist, above only wedge-ordered regions remain.

3. In the vicinity of Tl, the derivative $$\frac{\partial f}{\partial T}$$

and therefore the enhancement factor become large. Upon cooling below, the enhancement factor decreases first rapidly and then gradually, so that the super-pyroelectric effect exists within a range of a few tens of degrees (FIG. 3C, solid line).

4. Above $T_1$, the pyroelectric current must be close to zero because no linear regions remain. The existence of some small pyroelectric current above $T_1$ can be caused by the fact that a real film has areas that are not bent, for instance at the center and in the corners.

Figure 4A:
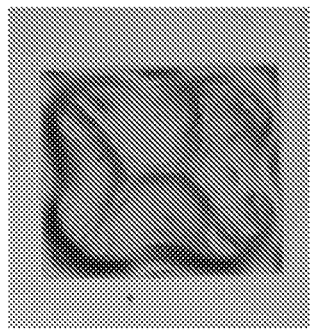
FIGS. 4A-4C show optical images of a self-supported film of $BaTiO_3$ of 750 nm thickness, 350×260 μm lateral dimensions and $\in_1$≈5% excess length, where
Figure 4B:
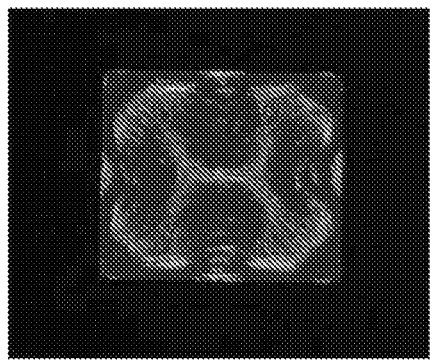
Figure 4C:
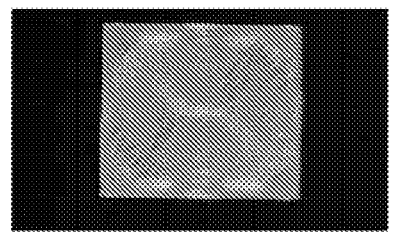

FIGS. 4A-4C show optical images of a self-supported film of BaTiO$_3$ of 750 nm thickness, 350×260 μm lateral dimensions and $\epsilon_1 \approx 5\%$ excess length. FIG. 4A shows a top view in reflected light at room temperature. FIGS. 4B and 4C show views with transmitted cross-polarized light at room temperature (FIG. 4B) and at 90° C. (FIG. 4C). Because for BaTiO$_3$, there is more than 7% difference in refractive index (at a wavelength of 700 nm) parallel and perpendicular to the c-axis, the wedge-ordered regions have a different refractive index in the direction along the curvature axis and normal to it, i.e., they have strong birefringence. The linear regions have a uniform refractive index within the film plane and therefore have no birefringence. Therefore, if viewed in cross polarized light, the wedge-ordered regions appear light and the linear regions appear dark. As indicated above, the birefringent (light) areas are the wedge-ordered regions. The wedge-ordered regions exhibit strong birefringence if viewed in transmitted cross-polarized light, whereas the linear regions do not show birefringence under the same conditions. Therefore, the wedge-ordered regions can be directly monitored with an optical microscope. Indeed, at room temperature, the wedge-ordered regions occupy a small fraction of the 750 nm thick, 170 μm long film (FIGS. 4A, 4B); whereas at 90° C. all parts of this film are birefringent (FIG. 4C), indicating that the linear (non-birefringent) regions have vanished and the film contains only wedge-ordered regions. Cooling restores the film to its original state (FIG. 4C). Thus, the macro-domains rearrange in response to temperature variation and at above temperature T1 only wedge-ordered regions exist.

As shown above, rapid rearrangement of the polycrystalline macro-domains can provide a straightforward explanation of the super-pyroelectric effect, the origin of which is fundamentally different from regular pyroelectricity. The latter is due to changes in the absolute value of the polarization. The former is due to reversible 90° polarization switching at the grains at the boundary between the linear and the wedge-oriented regions. The stress arising due to a change in temperature is concentrated at the boundary between the linear and the wedge-oriented regions and facilitates 90° polarization switching. Such switching results in changes in the total polarization in the out-of-plane direction which are much larger than those observed for either primary or secondary pyroelectricity. Similar phenomenon can be observed in a polydomain single crystal, where mechanical stress in response to temperature variation may also move 90° domain walls in constrained single crystalline ferroelectric films. However, displacement of domain boundaries in polycrystalline macro-domains would be expected to occur much more rapidly than in single crystals, because the thickness of the domain walls between them are of the order of magnitude of a few grains, rather than one unit cell as in crystals. In buckled films, the super-pyroelectric current is generated in a small fraction of the film volume but its contribution to the total effect is large. One may anticipate existence of film configurations with a large density of macro-domain boundaries and, therefore, yet larger super-pyroelectric effect. One has to emphasize that the super-pyroelectric effect appears only if the macro-domains can follow temperature change. Remarkably, in our case, the macro-domains rearrange within a few μsec. This indicates that they can rapidly reach an equilibrium state, which is consistent with the observed periodicity of the wedge-ordered regions.

The most important practical consequence of the rapid and reversible rearrangement of the macro-domains is that it gives the films the ability to adapt to external mechanical constraints. The films with macro-domains do not accumulate mechanical stress in response to small deformations. Therefore, systems with polycrystalline macro-domains open a wide range of new opportunities for creating materials with exceptional mechanical stability.

The process for forming a super-pyroelectric effect in polycrystalline macro-domains organized into linear and wedge-ordered regions in a buckled nanocrystalline ferroelectric film is as follows: in a forming step a buckled film, such as film 110, is formed. The buckled films spontaneously form macro-domains. Thereafter in a contact forming step, contacts are formed on the upper and lower surfaces of the buckled region, typically by sputtering. To induce a super-piezoelectric effect, a heat or energy source can be used to heat the film. Alternatively, sound wave pressure energy is applied to the film.

It should be noted that this invention is also directed to devices comprising one or more buckled film, exhibiting super-pyroelectricity. Devices employing the super-pyroelectric effect include, but are not limited to, motion sensors and uncooled radiation detectors and arrays made of them.

Figure 5A:
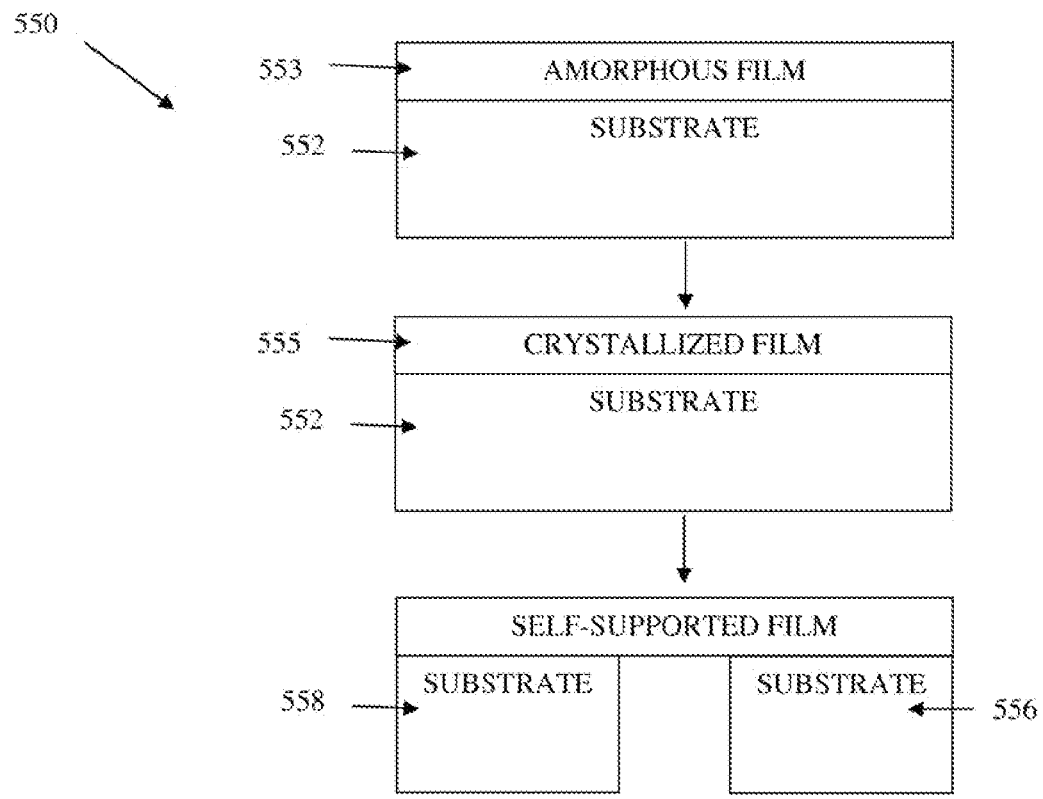
FIG. 5A is a simplified schematic illustration of a prior art process for forming a self-supported film.

FIG. 5A is a simplified schematic illustration of a prior art process 550 for forming a self-supported film. An amorphous film 553 is first deposited on a substrate 552. Thereafter, a crystallized film 555 is formed on substrate 552. The substrate is then etched to form at least one window or hole in the substrate 552 to form at least two spaced-apart substrate portions 556, 558.

Figure 5B:
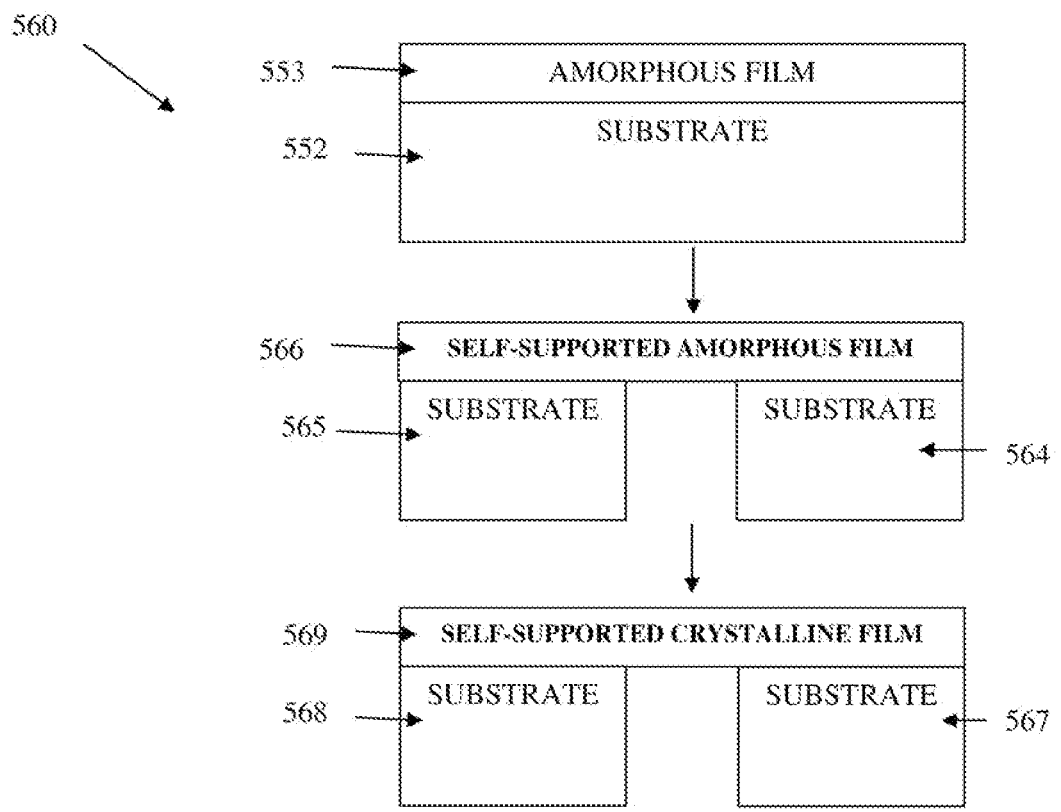
FIG. 5B is a simplified schematic illustration of a process for forming a self-supported film, in accordance with some embodiments of the present invention.

FIG. 5B is a simplified schematic illustration of a process 560 for forming a self-supported film, in accordance with some embodiments of the present invention. An amorphous film 553 is first deposited on a substrate 552 as in the prior art process. Thereafter, at least one window or hole is etched in the substrate 552 to form at least two spaced-apart substrate portions 564, 565 upon which an amorphous self-supported film 566 resides. In a subsequent crystallization process, a self-supported crystalline film 569 is formed.

An amorphous layers of, for example, $BaTiO_3$ were deposited at room temperature by RF oxygen/argon (80/20 v/v, $4 \times 10^{-3}$ mBar) plasma sputtering from a stoichiometric target on (100)-oriented n-type Si substrates (280±20 μm thick, 1-10 Ωcm). The chemical composition of the amorphous $BaTiO_3$ was verified by energy dispersive X-ray fluorescence spectroscopy (EDS, Oxford, approximate measurements) and X-ray photoelectron spectroscopy (XPS, Kratos, precise measurements). Calibration for both techniques was performed with respect to stoichiometric $BaTiO_3$ (Semiconductor Materials, 99.95%). Only the films for which the deviation from stoichiometry was smaller than 0.2% were used for the experiments. Anisotropic local etching of Si substrates with an aqueous solution containing 50% $(NH_2)_2$ and 2% KOH (w/w) at 90° C. was performed for 5 hrs. This etching step produced, in some cases, 150-250 μm square windows with self-supported films. The etching solution does not attack either amorphous $BaTiO_3$ or Si. According to XPS, the etching processes do not contaminate either the front or back surfaces of the film and complete removal of the silicon was achieved. The self-supported amorphous film is then crystallized. This step was performed, for example, by heating the tethered films at 600° C., as is described in the recent publication V. Lyahovitskaya, Y. Feldman, I. Zon, E. Wachtel, I. Lubomirsky, and A. L. Roytburd, *Adv. Mater.* 2005, 17, 1957, which is incorporated herein by reference. The heating of the self-supported films was performed in air in a horizontal oven under isothermal conditions maintained with a spatial uniformity better than 0.01° C./mm. Following each stage of heating treatment, the preservation of the chemical composition of the films was monitored by XPS. No deviation from stoichiometry as a result of heat treatment was found. The surface morphology of the films was analyzed with atomic force microscopy (AFM, Topometrics). The crystallinity of the self-supported films was characterized by transmission wide angle X-ray diffraction (WAXD, 90° incidence angle, 2 θ-detection limits=20-50°, by electron diffraction (ED in TEM) and by high resolution transmission electron microscopy (HRTEM, Phillips CM-120). The spectral dependence of the optical absorption of each film was measured with a Varian Cary 50 Probe UV-Vis spectrophotometer before and after each step of the heating process. The optical band gaps were estimated by linear fitting of 1 $n(r)^2$–E for a direct band gap and of $\ln(\tau)^{1/2}$–E for an indirect band gap, where $\tau$ is the optical absorption of a film and E is the photon energy.

According to the methods disclosed in the above-indicated publications, V. Lyahovitskaya, Y. Feldman, I. Zon, E. Wachtel, I. Lubomirsky, and A. L. Roytburd, *Adv. Mater.* 2005, 17, 1957, and I. Ebralidze, V. Lyahovitskaya, Y. Feldman, I. Zon, E. Wachtel, I. Lubomirsky, J. Mater. Chem. 2005 15:4258-4261, for forming buckled films, the crystallization step precedes the etching step such that the crystallization step is performed to the amorphous film prior to the removal of windows to form a self-supported crystalline film. This technique might not provide the same degrees of freedom (due to a lack of freedom to move/migrate above/below the plane in regions where windows have been removed) to the crystalline film. The inventors have found that the formation of the super-pyroelectric effect can be achieved by first forming the window (hole) in the substrate and then applying a crystallization step.

The crystallization of the self-supported amorphous film allows the nano-crystalline grains to spontaneously form polycrystalline macro-domains, mimicking the elastic domains of single crystals (see V. Lyahovitskaya, Y. Feldman, I. Zon, E. Wachtel, I. Lubomirsky, and A. L. Roytburd, *Adv. Mater.* 2005, 17, 1957).

Minimization of the stress arising between the grains undergoing transformation from the cubic (para-) to the tetragonal (ferro-electric) phase causes the grains to form regions (polycrystalline macro-domains) in which the directions of the crystallographic axes of the grains are correlated. These macro-domains may form extended periodic structures with a multilevel hierarchy requiring self-organization of tens of millions of individual grains [V. Lyahovitskaya, Y. Feldman, I. Zon, E. Wachtel, I. Lubomirsky, and A. L. Roytburd, *Adv. Mater.* 2005, 17, 1957].

The films were poled by application of ≈3 V electrical bias for 10-15 hrs. The polarization hysteresis loop could not be observed because fast switching of the polarization causes mechanical disintegration of the films. A step-like periodic irradiation of the films with a semiconductor laser ($\lambda$–1380 nm, 3 mW/mm$^2$, absorption coefficient of the contacts 15±5%) generates electrical current that only flows in response to switching the laser on and off (FIG. 2A inset). This behavior persists unchanged for >7 days ($10^{11}$ cycles). The phase of the pyroelectric current with respect to the heating/cooling cycle can be inverted by reversing the poling bias. These facts uniquely identify the pyroelectric origin of the current and prove that the films were in the ferroelectric phase [V. Lyahovitskaya, Y. Feldman, I. Zon, E. Wachtel, I. Lubomirsky, and A. L. Roytburd, *Adv. Mater.* 2005, 17, 1957].

Moreover, it should be noted that polycrystalline macro-domains in self-supported buckled films of nanocrystalline are able to undergo rapid and reversible rearrangement, in which the constituent grains exhibit a spontaneous preferential alignment of their crystallographic axes. The rearrangements are driven by stress minimization and represent mutual transformation of regions in which the average alignment of c-axes are either parallel or perpendicular to the plane of the film. Depending on the difference between the linear dimensions of the film and that of the window to which it is tethered, the film may exhibit three distinctive types of macro-domain rearrangement. Films for which the difference in linear dimensions is approximately 3% exhibit a strongly enhanced pyroelectric coefficient (1 µCl/(cm$^2$·K)), which is attributed to the contribution of 90° polarization switching in grains located at the macro-domain boundaries. The characteristic time for macro-domain rearrangement was found to be <0.1 ms. Due to the mobility of macro-domain boundaries, the self-supported films do not accumulate mechanical stress in response to small deformation. Instead, they reversibly adapt to external mechanical constraints. Therefore, systems with polycrystalline macro-domains may open a wide range of new opportunities for creating materials with exceptional mechanical stability.

The fact that heating and cooling produce reversible changes in the relative amounts of linear and wedge-ordered regions indicates that they undergo reversible rearrangement. Rearrangement of macro-domains may only occur if the linear and wedge-ordered regions transform into one other. The driving force for this transformation is that, in response to temperature variations, the crystallographic parameters c and a change. As a result, the curvature radius of the wedge-ordered regions is altered and the relative amounts of the linear and wedge-ordered regions corresponding to the minimum elastic energy change as well. To implement this change, some of the grains at the boundaries between these regions must reversibly switch from an out-of-plane to an in-plane macro-domain and vice versa ("90° switching"). Thus "grain exchange" between macro-domains takes place and it is this mechanism that permits the films to change their lateral dimensions, that is, to "adapt" to the mechanical constraints imposed by the window in response to temperature variation.

Since no dependence of the rate of macro-domain rearrangement on the heating rate was observed one has to conclude that the process is sufficiently rapid that the macro-domains are in quasi-equilibrium at any temperature. In general, the ability of the macro-domains to exchange grains is, most probably, due to the fact that the number of possible variants (orientations) for polycrystalline macro-domains is unlimited. Since each grain contacts its neighbors across a grain boundary that does not require continuity of the crystal lattice, the transformation of a grain from one variant to another can be easily induced by external mechanical stress. Therefore, boundaries between polycrystalline macro-domains are not "domain walls" in the usual sense, but rather highly mobile transition regions. These "transition regions" between polycrystalline macro-domains are in especially sharp contrast to elastic domains in single crystals, where due to the small number of possible variants and continuity of the crystal lattice, the thickness of the domain walls is of the order of one unit cell.

The enhanced pyroelectric effect is basically different from regular (primary and secondary) pyroelectricity. The "regular" pyroelectricity is due to changes in the absolute value of the polarization. The enhanced pyroelectricity described here arises due to reversible 90° polarization switching of the grains at the boundary between the linear and the wedge-oriented regions. Another point to be noted is that in self-supported buckled films, the enhanced pyroelectric current is generated in a small fraction of the area of the film but its contribution to the total effect is large.

The invention claimed is:

1. A self-supported crystalline film having nano-sized grains being in a ferroelectric phase and having at least three different crystallographic variants defining at least two polycrystalline macro-domains, said nano-sized grains being self-organized into linear and wedge-ordered arc-shaped regions; the film being shaped to define at least one film region comprising a buckled region being self-supported by a substrate; said buckled region having macro-domains of a predetermined shape and different orientations of crystallographic axes with respect to the film's surface, said buckled region being formed by first creating a window in said substrate to form at least two-spaced-apart portions upon which an amorphous self-supported film resides and then applying a crystallization step to said amorphous self-supported film to create a self-supported crystalline film; upon applying a temperature change to the self-supported crystalline film induce movement of the polycrystalline macro-domains boundaries, the films being configured to have a minimal difference between dimension of said linear regions and dimensions of said window to thereby enable super-pyroelectric properties.

2. The film of claim 1, wherein said ferroelectric material is barium titanate ($BaTiO_3$).

3. The film of claim 1, wherein said nano-sized grains are self-organized into macro-domains with the out-of-plane and in-plane orientations of the crystallographic axes thus undergoing further self-organization into linear and wedge-ordered arc-shaped regions.

4. The film of claim 3, wherein said temperature variation changes both the magnitude of the polarization in all grains and the fraction of linear and wedge-ordered regions.

5. The film of claim 3, wherein said linear regions contain only out-of-plane macro-domains, whereas said wedge-ordered regions include alternating in-plane and out-of-plane macro-domains.

6. The film of claim 1, wherein said film has a pyroelectric coefficient of at least $0.2\ \mu C/(cm^2 \cdot K)$.

7. The film of claim 1, wherein said buckled region comprises an excess length E, is defined as (l−w/w), wherein l is the length of the entire arc-shaped buckled region and w is the distance between the edges portions of the arc-shaped-region.

8. The film of claim 7, wherein the pyroelectric coefficient increases with increasing excess length.

9. The film of claim 7, wherein the excess length is at least 3%.

10. The film of claim 9, wherein the pyroelectric coefficient is up to $1\ \mu C/(cm^2 \cdot K)$.

11. A process for preparing a super-pyroelectric film of claim 1, the method comprising:

forming a film from a ferroelectric material, which film has nano-sized ferroelectric grains self-organized into polycrystalline macro-domains and which is shaped to define at least one film region with the macro-domains of a predetermined shape and different orientations of crystallographic axes with respect to the film's surface; and, applying a temperature change to the material so as to induce a super-pyroelectric effect associated with said at least one region of the film.

12. The process of claim 11, wherein said at least one region is an arc-shaped region.

13. The process of claim 11, wherein said at least one region comprises a buckled film.

14. The process of claim 11, wherein the buckled film is self-supported by a substrate.

15. The process of claim 11, wherein said ferroelectric material is barium titanate (BaTiO3).

16. The process of claim 12, wherein applying a temperature change to the material affects the curvature of said arc-shaped region.

17. The process of claim 16, wherein increasing the temperature applied to the film results in an increase in the curvature of the arc-shaped region.

18. The process of claim 12, wherein the film comprises said arc-shaped region enclosed between linear-shaped regions.

19. The process of claim 18, wherein applying a temperature change to the film induces a greater proportion between the arc-shaped region and linear-shaped regions enclosing said arc-shaped region therebetween.

20. A device comprising one or more films, each according to claim 1, exhibiting super-pyroelectricity, each of the-said one or films having nano-sized grains being in a ferroelectric phase and having at least three different rystallographic variants defining at least two polycrystalline macro-domains, the film being shaped to define at least one film region with the macro-domains of a predetermined shape and different orientations of crystallographic axes with respect to the film's surface, thereby enabling to apply a temperature change to the film to induce movement of the polycrystalline macro-domains boundaries enabling super-pyroelectric properties.

* * * * *